United States Patent [19]
Takagi et al.

[11] Patent Number: 4,789,242
[45] Date of Patent: Dec. 6, 1988

[54] OPTICAL APPARATUS FOR DETECTING THE POSITION OF AN OBJECT

[75] Inventors: Shuhei Takagi, Yokohama; Makoto Uehara; Koichi Matsumoto, both of Tokyo, all of Japan

[73] Assignee: Nikon Corporation, Tokyo, Japan

[21] Appl. No.: 894,840

[22] Filed: Aug. 8, 1986

[30] Foreign Application Priority Data

Aug. 13, 1985 [JP] Japan ................... 60-178422

[51] Int. Cl.⁴ .................................. G01B 11/00
[52] U.S. Cl. .......................... 356/375; 356/372
[58] Field of Search ............... 356/375, 400, 401, 372

[56] References Cited

U.S. PATENT DOCUMENTS 4,202,627  5/1980  Suzki et al. .................... 356/401
4,630,927  12/1986  Fulkerson ...................... 356/372

Primary Examiner—R. A. Rosenberger
Assistant Examiner—Crystal Cooper
Attorney, Agent, or Firm—Shapiro and Shapiro

[57] ABSTRACT

An optical apparatus comprising a laser light source, an optical system for focusing a beam of light from the laser light source onto an object surface through an objective lens and a spatial filter disposed at the entrance pupil of the objective lens or at a position conjugated with the entrance pupil, wherein the origin of the divergence of the laser beam having an angle of divergence emitted from the laser light source is projected on the entrance pupil of the objective lens by the optical system.

4 Claims, 5 Drawing Sheets

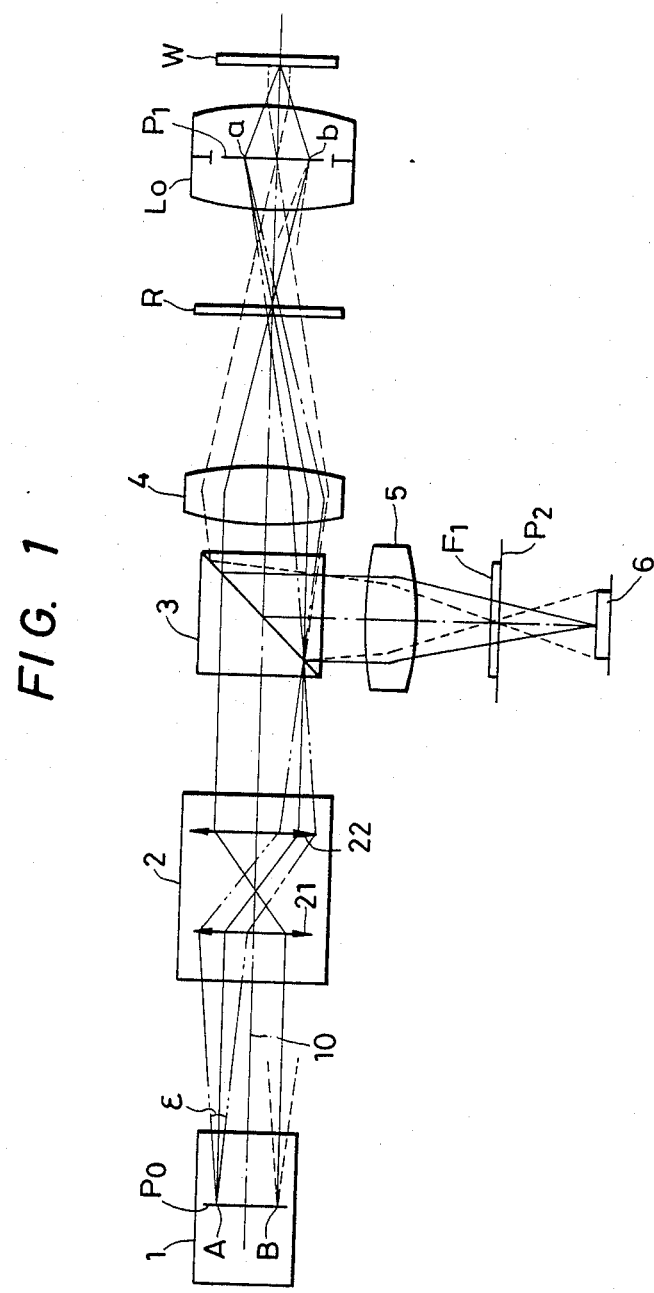

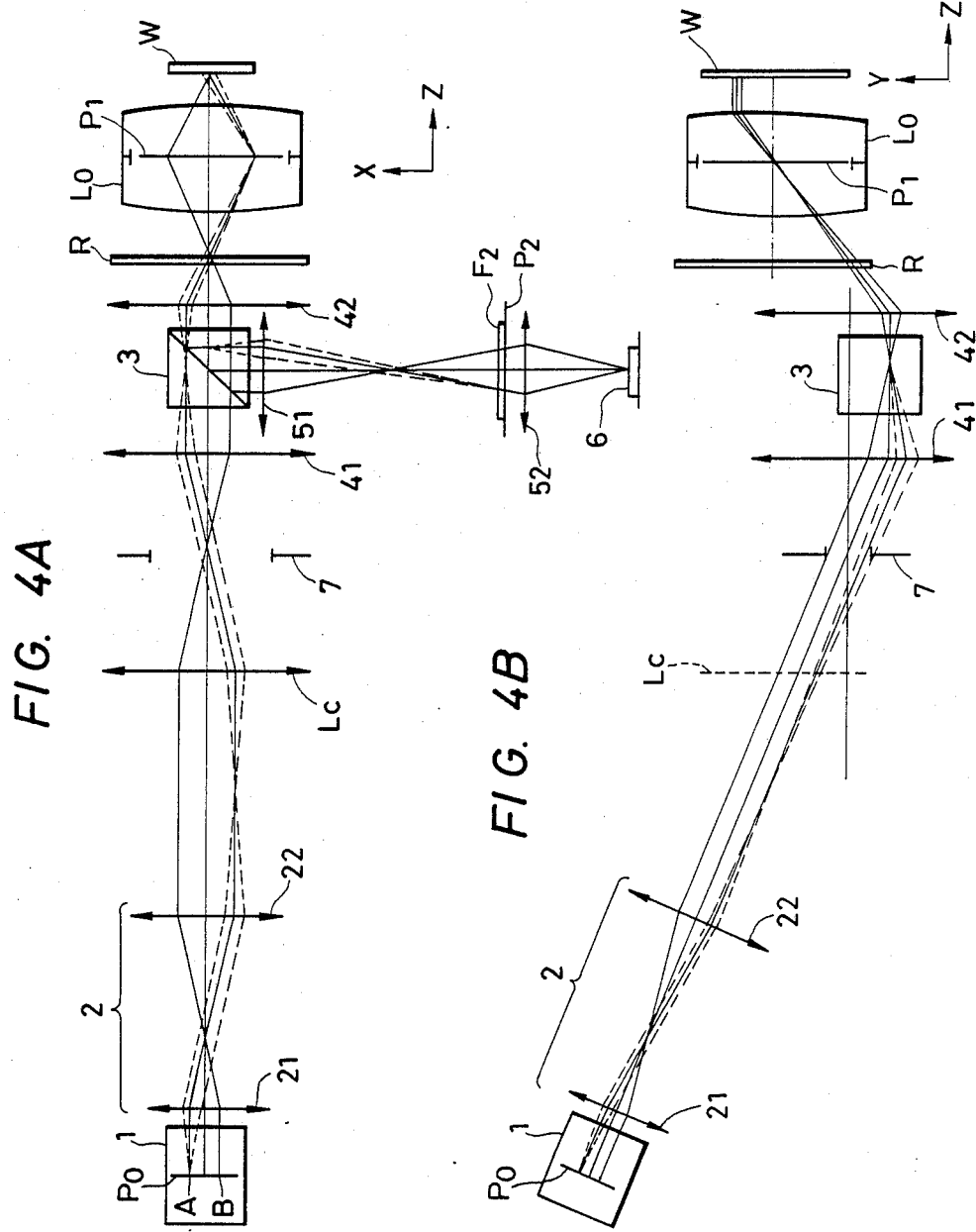

OPTICAL APPARATUS FOR DETECTING THE POSITION OF AN OBJECT

BACKGROUND OF THE INVENTION

1. Field of the Invention

The present invention relates to an optical apparatus for detecting the position of an object by sensing the light from the object through an objective lens. More specifically, the present invention relates to an optical position-detecting apparatus of the type in which a laser beam is projected onto an object to be examined through an objective lens and the scattered or diffracted light from the object is received to detect the position of the object.

2. Related Background Art

In the known projection type exposure apparatus now used in the manufacture of semiconductor elements such as LSI, an optical alignment system is needed to align a reticle (or a mask) with a wafer very precisely. An optical alignment system making use of laser beam has been known and widely used for this purpose.

In this alignment optical system according to the prior art, the position of a wafer as an object to be examined is detected in the following manner:

A laser beam is focused on the wafer. The focused light is reflected, scattered or diffracted by the surface of the wafer having an alignment mark preformed. The reflected, scattered or diffracted light is received through a spatial filter disposed at the pupil of an objective lens or at a position conjugate with the pupil of the objective. The received light contains information of the position of the alignment mark. The position of the alignment mark is detected as a position on a coordinate system orthogonal to the optical axis of the objective lens to know the exact position of the wafer.

The function of the spatial filter used in the above apparatus is to cut off the normal reflection light from the object surface and to transmit only the scattered light or the diffracted light derived from the alignment mark. Through the spacial filter it is possible to detect the alignment mark in a dark view field and, therefore, it is possible to improve the accuracy in the detection of position.

However, the prior art apparatus involves a problem of noise. A laser beam usually contains not only parallel rays to the optical axis but also some oblique rays which have a small angle of divergence relative to the optical axis (hereinafter, such oblique rays of the laser are referred to as the divergent rays). This is true also for gas laser which is generally regarded as a beam of parallel rays. These oblique rays produce a halo, that is, an area lightly blurred with light surrounding the entrance pupil of the objective lens. Because of this phenomenon, when the light from the object is filtered at the entrance pupil or at a conjugated point with it, the divergent rays form noise which disturbs the correct detection of object position.

SUMMARY OF THE INVENTION

Accordingly, the principal object of the present invention is to provide an optical apparatus for the detection of position using a laser beam which is able to detect the position of an object with high accuracy irrespective of the existence of those rays which have an angle of divergence.

According to the present invention, the above object is attained by an optical apparatus comprising a laser light source; an optical system for focusing a beam of light from said laser light source onto an object surface through an objective lens; and a spatial filter disposed at the entrance pupil of said objective lens with respect to the side of said laser light source or at a position conjugated with the entrance pupil, wherein the origin of the divergence of the laser beam having an angle of divergence emitted from said laser light source is projected on the entrance pupil of said objective lens by said optical system.

With the construction of the position-detecting optical apparatus according to the invention, even divergent rays of a laser beam are focused on the entrance pupil of a laser beam and, therefore, there is produced no halo of the laser beam on the entrance pupil. This assures good filtering by the spatial filter at the entrance pupil or at a conjugated point with the entrance pupil. A substantial improvement in the accuracy of position detection can be attained by it.

Other objects, features and advantages of the invention will appear more fully from the following description taken in connection with the accompanying drawings.

BRIEF DESCRIPTION OF THE DRAWINGS

FIG. 1 schematically shows a first embodiment of the invention;

FIG. 4A is a schematic exploded view of the optical path in cross section taken in the sagittal direction of a second embodiment in which the present invention has been applied to an alignment optical system in a minifying projection type exposure apparatus;

FIG. 4B is a schematic exploded view of the optical path of the second embodiment in cross section taken in the meridional direction;

DESCRIPTION OF THE PREFERRED EMBODIMENTS

Figure 2A:
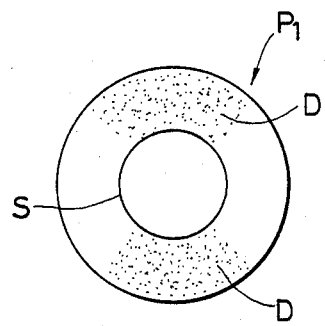
FIG. 2A is a plan illustrating the state of a beam on the entrance pupil of the projection objective lens of the first embodiment.

Referring first to FIG. 1 there is shown a first embodiment of the optical apparatus for the detection of position according to the present invention. In this embodiment, the present invention has been applied to the alignment optical system of a minifying projection type exposure apparatus used for the manufacture of semiconductor elements such as LSI.

In the figure the reference numeral 1 denotes a laser light source which emits a beam of laser light. The beam is expanded in beam width by a beam expander 2 at a predetermined magnification and then passes through a beam splitter 3. After passing through the beam splitter, the beam is once focused on a reticle R by a condenser lens 4. $L_o$ denotes a telecentric projection objective lens. W denotes a wafer as the object whose position is to be detected. The wafer W is on a stage. The reticle R and the wafer W are so disposed as to hold a conjugated relation therebetween relative to the objective $L_o$. The laser beam transmitted through the reticle R is refocused on the wafer W through the objective $L_o$.

The reflected light (including scattered light and diffracted light) from the wafer W enters again the objective $L_o$. After passing through the reticle R and the condenser lens 4, the beam is reflected toward a relay lens 5 by the beam splitter 3. The relay lens 4 transmits the reflected beam to a photo-sensor 6 which generates a signal corresponding to the intensity of the light then received. $F_1$ is a spatial filter on which an entrance pupil plane $P_1$ of the projection objective lens $L_o$ with respect to the side of the laser light source is projected through the condenser lens 4 and the relay lens 5. The beam of reflected light from the wafer W is filtered by this spatial filter $F_1$.

The laser beam emitted from the laser light source 1 contains not only those rays running parallel to the optical axis 10 but also such rays having an angle $\epsilon$ of divergence as suggested by two-dotted chain lines in FIG. 1. The origins of divergence angle $\epsilon$ of these rays are distributed on a plane $P_o$ normal to the optical axis at the so-called beam waist. Therefore, the laser radiation beam appears as if it was emitted from the plane $P_o$. The rays of the beam may be regarded as being radiated from the plane $P_o$. We, therefore, refer to the plane $P_o$ as virtual radiation plane.

An important feature of the present invention is that the virtual radiation plane $P_o$ is projected on the entrance pupil plane $P_1$ of the projection objective lens $L_o$ through an optical system including the beam expander 2, the condenser lens 4 etc. In FIG. 1, a beam having an angle of divergence $\epsilon$ is emitted from a point A on one end of the virtual radiation plane $P_o$ and focused at a point a on the entrance pupil plane $P_1$ of the objective lens. Similarly, another beam having a divergent angle $\epsilon$ is emitted from a point B on the opposite end of the virtual radiation plane $P_o$ and is focused at a point b on the entrance pupil plane $P_1$ of the projection objective lens. Therefore, as seen from FIG. 2A, all of the radiation rays from the laser light source 1 pass through the entrance pupil plane $P_1$ of the lens $L_o$ exactly within a circular area S. There is no ray blurred out of the circular area S.

In order to project the virtual radiation plane $P_o$ on the entrance pupil plane $P_1$ of the projection lens $L_o$ and to focus the beam of the divergent angle $\epsilon$ from the plane $P_o$ on the entrance pupil plane $P_1$ of the lens $L_o$, it is necessary for the beam expander 2 to be formed as a so-called Kepler type afocal system composed of two lens groups 21 and 22 as shown in FIG. 1. If a Galileo type afocal system is used as the beam expander, the projection of the virtual radiation plane $P_o$ on the entrance pupil plane $P_1$ can be performed only by a very complicated construction because it is required, for example, to add a Kepler type afocal system to the Galilean afocal system. In this case, it is hardly possible to completely exclude the blurring of light caused by the divergent angle $\epsilon$ of the laser beam.

As previously mentioned, the wafer W has an alignment mark formed on the surface. The alignment mark is a part projecting from the surface of the wafer. The rays normally reflected by the wafer W return back into the circular area S on the entrance pupil plane $P_1$ of the projection objective lens $L_o$. On the contrary, those rays which are scattered by the edges of the alignment mark and reflected back to the entrance pupil plane $P_1$, do not enter the circular area S but enter the area outside of the circular area S as indicated by dots D in FIG. 2A.

Figure 2B:
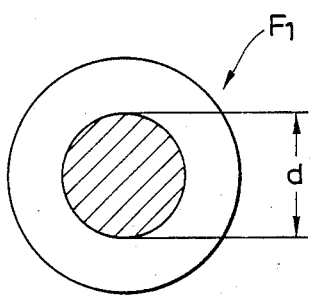
FIG. 2B is a plan of the spatial space filter of the first embodiment.

In order to detect these scatter-reflected rays D, there is provided a spatial filter $F_1$ at the entrance pupil plane $P_1$ of the projection objective lens $L_o$ or at a point $P_2$ conjugated with the entrance pupil plane as shown in FIG. 1. FIG. 2B shows the form of the spatial filter $F_1$. The spatial filter has a circular screen area of d in diameter for blocking off the normal reflection light returning back along the optical axis from the wafer. The scatter-reflected light from the alignment mark passes through the filter at the area outside of the screen area. Therefore, the alignment mark can be detected by sensing the scatter-reflected light by a photo-sensor 6 in a dark viewfield.

In the apparatus according to the invention, as described above, the laser beam is definitely shaped without any blurring on the entrance pupil plane $P_1$ of the projection lens $L_o$. The area S in which the normal reflection light from the wafer W returns can be defined clearly in the entrance pupil plane $P_1$. This means that the size of the screen area (the size of the circular area having a diameter d in FIG. 2B) which the spatial filter F, should have on the optical axis can be reduced to the minimum and that the largest amount of the scatter-reflected light from the alignment mark on the wafer can be received for the detection of the mark. Thus, according to the present invention, it is possible to remarkably improve the S/N ratio in the detection signal of an alignment mark on the wafer W.

Figure 3A:
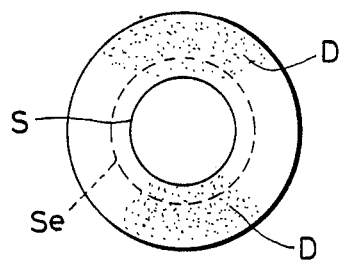
FIG. 3A is an illustrative view showing the state of a beam on the entrance pupil of the projection lens when the position of the light source is deviated in the direction along the optical axis in FIG. 1.
Figure 3B:
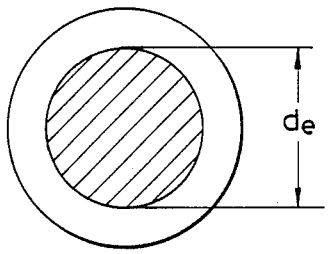
FIG. 3B is an illustrative view showing the form of the spatial filter when the position of the light source is deviated in the direction along the optical axis in FIG. 1.

The advantage of the apparatus of the present invention over the prior art is obvious from FIGS. 3A and 3B.

In the prior art apparatus, the angle of divergence $\epsilon$ of the laser beam has not been taken into consideration. Therefore, when the virtual radiation plane $P_o$ of the laser light source 1 is at a position deviated from the conjugated position with the entrance pupil plane, such rays having a divergent angle $\epsilon$ of the laser beam blur out into a circular area Se (indicated by a broken line in FIG. 3A) on the entrance pupil plane $P_1$ of the projection objective lens $L_o$. As readily seen from FIG. 3B, the spatial filter $F_1$ is required to have a larger screen area of de in diameter (de>d) on the optical axis in order to block off the normal reflection light from the wafter W. Because of the large size, the screen area of the spatial filter undesirably cuts off some of the weak scatter-reflected light from the alignment mark which is to be detected. Consequently, the S/N ratio is low in the prior art apparatus.

A second embodiment of the present invention is shown in FIGS. 4A and 4B in which like reference characters to FIG. 1 represent functionally the same members and elements.

Referring to FIG. 4A which is a sectional view taken in the sagittal direction of the second embodiment, a laser beam from a laser light source 1 is expanded to a determined beam width by a beam expander 2. The beam expander 2 is of the Kepler type afocal system composed of two positive lenses 21 and 22.

Herein, for the purpose of explanation, X-Y-Z three-dimensional coordinate are used. The section in the sagittal direction is on the X-Z plane and that of the meridional direction is on the Y-Z plane of the three-dimensional coordinates.

The expanded parallel beam is converged by a cylindrical lens $L_c$ which has a converging action in the sagittal plane. Further, the beam is collimated by a first condenser lens 41. After passing through a beam splitter 3, the collimated beam is focused on a reticle R by a second condenser lens. The beam focused on the reticle R is in the form of a light spot elongated in the Y direction. The laser beam once focused on the reticle R is refocused, as a light spot elongated in the Y direction, on a wafer W conjugated with the reticle R regarding the projection objective lens $L_o$.

FIG. 4B shows a meridional section of the second embodiment. In the meridional plane, the cylindrical lens $L_c$ has no refractive power. Therefore, the parallel beam expanded by the Kepler type afocal system beam expander 2 enters the first condenser lens 41 as it is. After passing through the beam splitter 3 and the second condenser lens 42, the laser focuses at the entrance pupil $P_1$ of the projection lens $L_o$ and further the principal rays emerge the lens $L_o$ as rays running parallel with the optical axis of the lens to telecentrically illuminate the wafer W.

Figure 5:
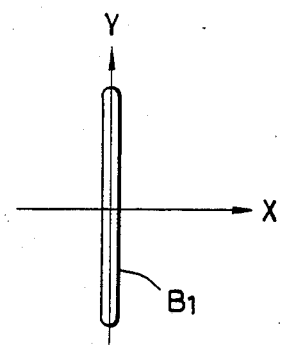
FIG. 5 is a plan view showing the form of a beam spot focused on an object surface in the second embodiment.
Figure 6:
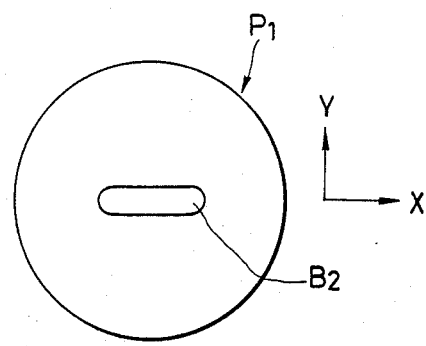
FIG. 6 is a plan view showing the state of a beam on the entrance pupil of the projection objective lens in the second embodiment.

In the second embodiment in which a cylindrical lens $L_c$ is additionally provided, the laser beam on the wafer W is in the form of a light spot $B_1$ elongated in the meridional direction (Y direction) as shown in FIG. 5. On the other hand, the laser beam on the entrance pupil $P_1$ of the projection lens $L_o$ is in the form of a light spot $B_2$ elongated in the sagittal direction (X direction) as shown in FIG. 6. Between the cylindrical lens $L_c$ and the first condenser lens 41 there is provided a slit 7 at a point where the laser beam and the optical axis intersect. The slit 7 is elongated in the sagittal direction (X direction).

The function of the elongate slit 7 is to screen off the marginal portion in the meridional direction (Y direction) of the laser beam whose intensity distribution is a Gaussian distribution, thereby making the intensity distribution more uniform in the longitudinal direction of the light spot focused on the object surface.

Figure 7:
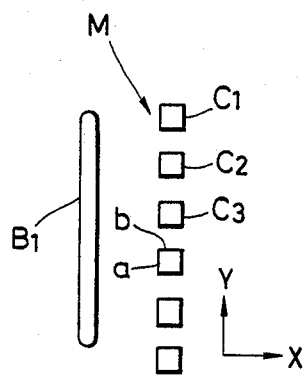
FIG. 7 is a plan view illustrating the forms of beam spot and alignment mark used in the second embodiment and their positional relationship as an example.

FIG. 7 shows an embodiment of the alignment mark formed on the wafer W.

In this embodiment, the alignment mark M is composed of square projection patterns $C_1$, $C_2$, $C_3$ arranged in a straight line in Y direction. This alignment mark M is scanned relatively by the laser light spot $B_1$ linearly elongated in Y direction.

When the light spot $B_1$ comes into a position to illuminate the alignment mark M, there is produced scattered light in X direction at first by the edges a along Y of the patterns $C_1$, $C_2$, $C_3$... The edges b along x of the patterns $C_1$, $C_2$, $C_3$.. practically function as diffraction grating grooves and, therefore, there is produced diffracted light in Y direction by these X side edges b of the patterns.

Figure 8:
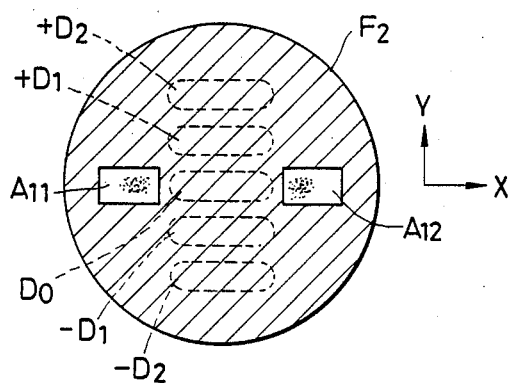
FIG. 8 is a plan view illustrating the state of a beam on the spatial filter in the second embodiment.

FIG. 8 shows the form of a spatial filter $F_2$ disposed conjugated with the pupil P of the lens $L_o$. At two off-axial positions which are substantially symmetric in X direction, the spatial filter has openings $A_{11}$ and $A_{12}$. The above-mentioned scattered light in the X direction produced by the Y side edges a of the alignment mark M (see FIG. 7) can pass through the openings $A_{11}$ and $A_{12}$ of the spatial filter $F_2$.

Figure 9:
FIG. 9 shows an output waveform as an example of the output of the photo-sensor in the second embodiment.

The edge of the alignment mark and, therefore, the position of the wafer can be detected by detecting the scattered light in the X direction and the diffracted light in the Y direction. In this manner one can obtain a detection signal. FIG. 9 shows a waveform of the output obtained by receiving the scattered light in X direction passed through the spatial filter $F_2$ in the above-described manner. By means of such an output signal, one can detect the position of the alignment mark M, that is to say, the position of the wafer.

The first order and second order diffracted light produced by the X side edges b of the mark patterns $C_1$, $C_2$, $C_3$... is distributed over the off-axial areas on the entrance pupil plane $P_1$ of the lens $L_o$ and on a plane conjugated with the entrance pupil. The distribution of the first order and second order diffracted light in Y direction is indicated by $\pm D_1$ and $\pm D_2$ in FIG. 8. The position of the alignment mark M can be detected also by detecting the diffracted light in Y direction produced by X side edges b of the alignment mark independently of the scattered light in X direction produced by the Y side edges a of the mark. To this end, such a spatial filter is used which has off-axial openings symmetrically arranged in the Y direction.

Figure 10:
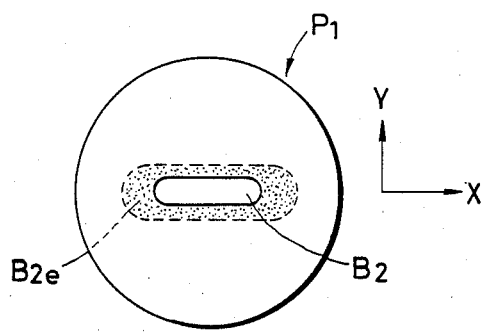
FIG. 10 is an illustrative view showing the state of the beam on the entrance pupil of the projection objective lens when the position of the light source is deviated in the direction along the optical axis in FIG. 4A.

In the alignment optical system using the above-shown alignment mark, high accuracy in the detection of position is assured only when the angle of divergence $\epsilon$ of the laser beam is taken into consideration according to the feature of the present invention. If the divergent angle $\epsilon$ is not taken into consideration for the above embodiment, there is produced a light-blurring area $B_{2e}$ as shown in FIG. 10 at the entrance pupil $P_1$ of the projection lens $L_o$ like the light-blurring area Se previously shown in FIG. 3A.

Figure 11:
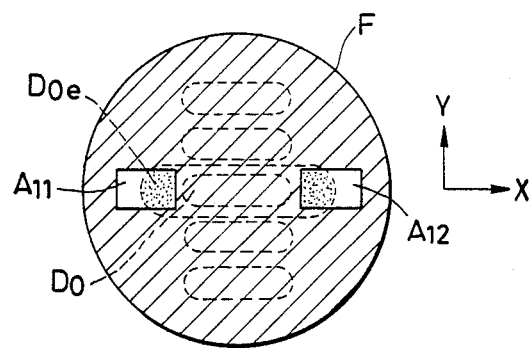
FIG. 11 is an illustrative view showing the state of the beam on the spatial filter when the position of the light source is deviated in the direction along the optical axis in FIG. 4A.

In FIG. 11, Do denotes the light directly reflected by the alignment mark M. Doe denotes blurring marginal rays of the normally reflected light. As shown in FIG. 11, some quantity of the blurring marginal rays Doe mingle in the openings $A_{11}$ and $A_{12}$ which have been provided for exclusively allowing the scattered light in X direction to pass through. The blurring light Doe passing through the openings $A_{11}$ and $A_{12}$ is undersirably sensed by the photo-sensor 6 disposed only for receiving the scattered light in X direction from the edge of the alignment mark M. Therefore, the output of the photo-sensor 6 contains noise as suggested by a phantom line in FIG. 9. Since such noise is generated in the apparatus, the accuracy in the detection of position is decreased as compared with the above embodiment of the invention.

As described above, in the second embodiment of the alignment optical system according to the invention, a cylindrical lens $L_c$ has been used to form a linear light spot $B_1$ on an object W. Even for this embodiment, the accuracy of filtering by the spatial filter $F_2$ can be improved by projecting the virtual radiation plane $R_o$ of the laser beam on the entrance pupil plane $P_1$ of the objective lens $L_o$ in the plane in which the cylindrical lens $L_c$ has a refractive power, as indicated by the broken line in FIG. 4A. Even in this case, it is preferable to use a Kepler type afocal system as the beam expander.

If X-rays are used to carry out the exposure on the wafer, the projection lens $L_o$ is omitted. Therefore, in this case it is necessary to provide an objective lens on the laser light source side relative to the reticle for the purpose of alignment.

As readily understood from the foregoing, the apparatus for the detection of object position according to the present invention has advantages over the prior art. It assures better spatial filtering and higher accuracy in the detection of object position in spite of the existence of a divergent angle of the laser beam.

Accordingly, the present invention has improved the accuracy of alignment for the projection type exposure apparatus necessary for the manufacture of semiconductor elements. It contributes to the production of semiconductor elements the fineness of which is increasing more and more.

What is claimed is:

1. An optical system for the detection of object position comprising:
    a laser light source;
    an objective lens for focusing a laser beam from said laser light source on an object surface;
    an illumination optical system for guiding said laser beam to said objective lens so as to project the origin of divergence of a divergent angle of said laser beam on an entrance pupil plane of said objective lens with respect to the side of said laser light source; and
    a detection optical system for detecting the reflected light from said object surface, said detection optical system including a spatial filter disposed on said entrance pupil plane of said objective lens or on a plane conjugated with said entrance pupil plane.

2. An optical apparatus for the detection of object position according to claim 1, wherein said illumination optical system comprises a beam expander composed of a Kepler type afocal system for beam-shaping the laser beam from said laser light source.

3. An optical apparatus for the detection of object position according to claim 1, wherein said illumination optical system comprises a beam expander composed of a Kepler type afocal system for beam-shaping the laser beam from said laser light source and a cylindrical lens having a refractive power for one axis only.

4. An alignment apparatus provided in an exposure apparatus for exposing on a substrate a pattern image formed by a projection lens, said alignment apparatus comprising:
    generation means for generating a laser beam;
    a first optical system for establishing a conjugated relation between an entrance pupil plane of said projection lens with respect to the side of said laser light source and a plane extending across the beam waist of the laser beam from said generation means;
    a second optical system for guiding a portion of the reflection light of the laser beam reflected from said substrate and passed through said projection lens, in a direction intersecting the optical axis of said projection lens;
    spatial filter means disposed in a plane conjugated with said entrance pupil plane of said projection lens regarding said second optical system; and
    means for detecting the intensity of said reflection light passed through said spatial filter.

* * * * *